United States Patent [19]

Netter et al.

[11] Patent Number: 5,068,786
[45] Date of Patent: Nov. 26, 1991

[54] METHOD FOR CONTROLLING RADIO FREQUENCY EXCITATION AND GRADIENT PULSE CHARACTERISTICS IN A MAGNETIC RESONANCE IMAGING SYSTEM

[75] Inventors: Zvi Netter, Haifa; Menachem Bar-Lev, Herzelia, both of Israel

[73] Assignee: Elscint Ltd., Haifa, Israel

[21] Appl. No.: 327,696

[22] Filed: Mar. 23, 1989

Related U.S. Application Data

[60] Division of Ser. No. 183,299, Apr. 11, 1988, Pat. No. 4,845,613, which is a continuation of Ser. No. 669,369, Nov. 8, 1984, abandoned.

[51] Int. Cl.⁵ .................. G06F 11/28; G06F 7/182
[52] U.S. Cl. .................. 395/800; 364/221.8; 364/224.5; 364/224.7; 364/232.8; 364/238; 364/238.4; 364/237.84; 364/270.1; 364/271; 364/271.5; 364/DIG. 1; 324/309; 324/312; 324/313; 128/689
[58] Field of Search ... 364/200 MS File, 900 MS File; 324/309, 312, 313; 128/689

[56] References Cited

U.S. PATENT DOCUMENTS

| | | | |
|---|---|---|---|
| 4,145,736 | 3/1979 | Yamada et al. | 364/200 |
| 4,205,375 | 5/1980 | Inouye et al. | 364/414 |
| 4,546,429 | 10/1985 | Chan et al. | 364/200 |
| 4,674,046 | 6/1987 | Ozeki et al. | 364/414 |
| 4,737,717 | 4/1988 | Petro | 324/320 |
| 4,739,268 | 4/1988 | Fox | 324/314 |
| 4,833,625 | 5/1989 | Fisher et al. | 364/518 |

Primary Examiner—Archie E. Williams, Jr.
Assistant Examiner—Emily Y. Chan
Attorney, Agent, or Firm—Sandler, Greenblum & Bernstein

[57] ABSTRACT

A pattern generator and controller arrangement operates for controlling the component parts of an MRI system. The arrangement comprises a plurality of channels including a main control channel and output channels. The arrangement receives instructions from the system CPU which then leaves the control and outputting to the arrangement, thereby avoiding the necessity of a large expensive CPU to operate the system with versatility and speed.

6 Claims, 4 Drawing Sheets

METHOD FOR CONTROLLING RADIO FREQUENCY EXCITATION AND GRADIENT PULSE CHARACTERISTICS IN A MAGNETIC RESONANCE IMAGING SYSTEM

This is a division of application Ser. No. 183,299 filed Apr. 11, 1988 which is a continuation of application Ser. No. 669,369 filed Nov. 8, 1984, now U.S. Pat. No. 4,845,613, now abandoned.

FIELD OF THE INVENTION

This invention is concerned with pattern generators used as controllers and with methods for generating patterns used for controlling imaging systems and more particularly to such pattern generators used for control purposes with Magnetic Resonance Imaging (MRI) Systems.

BACKGROUND OF THE INVENTION

Computerized Tomography has grown in sophistication along with the computers or central processing units (CPU's) that made such tomography possible. In MRI systems, even today's sophisticated CPU's are taxed into operating at the limits of their capacity. The control commands are often changed during the test (scans for the imaging of a patient) in addition to being changed prior to individual scans. Also, there are many more variables in MRI systems than in prior modalities. For example, among the factors varied from test to test and during a test are: the various gradients, the Rf signal amplitude, timing duration, frequency and shape. The control signals and patterns thus have to command analog and/or on-off type operators as well as meticulously shape wave forms for the Rf signal.

The MRI system tests acquire data giving information on T1, T2 and T*2 in addition to acquiring the actual FID signals. The computers are used to control the acquisition of the data and to process the acquired data to form the images. The variations in the control commands for the processing and the acquisition of data in the past have generally been under the direct control of the CPU. The many operations which must be performed by CPU's in MRI systems require expensive large computers or combinations of computers to accomplish the operations in a time efficient manner. Hence those skilled in the art have for many years been seeking ways and means to more effectively control MRI systems from a cost, time and versatility stand point.

It should be understood that while the pattern generators and controllers described herein are described with reference to MRI systems, the invention is broad enough to cover pattern generators and controllers in general. A pattern as used herein means a train of data.

Accordingly and object of the present invention is to provide new and improved controllers including pattern generators that are extremely fast and versatile without requiring large computers or combinations of computers.

Yet, another object of the invention is to provide controllers that operate as computers without arithmetic logic units.

According to the present invention pattern generator and controller arrangements are provided for controlling components of an MRI system, said pattern generator and controller arrangements comprising:

a plurality of channels, said plurality of channels including a main channel and output channels said main channel comprising means for controlling the operation of at least some of said output channels responsive to instructions received from a CPU prior to the commencement of a cycle, and each of said at least some of said output channels including means for supplying outputs for individualized control of the MRI system components.

A related feature of the invention is that the CPU is not burdened by the necessity of directly controlling the patterns sent to the various components of the MRI system. For example, the gradient signals including the encoding gradients, the timing of the gradient pulses, and the Rf pulses including the timing, duration, frequency, shape, and amplitudes of such pulses are controlled by the channels based on data placed in the channels prior to the scan cycles with the CPU released during the scan cycles.

The output channels include memory means. The output patterns are inputted to the particular output channel that provide the desired output patterns to the system components. The patterns are transmitted from the memory means of the output channels under the control of the main channel.

The above named and other objects and features of the present invention will be better understood when considered in the light of the following description taken in conjunction with the accompanying drawings; wherein:

GENERAL DESCRIPTION

Figure 1:
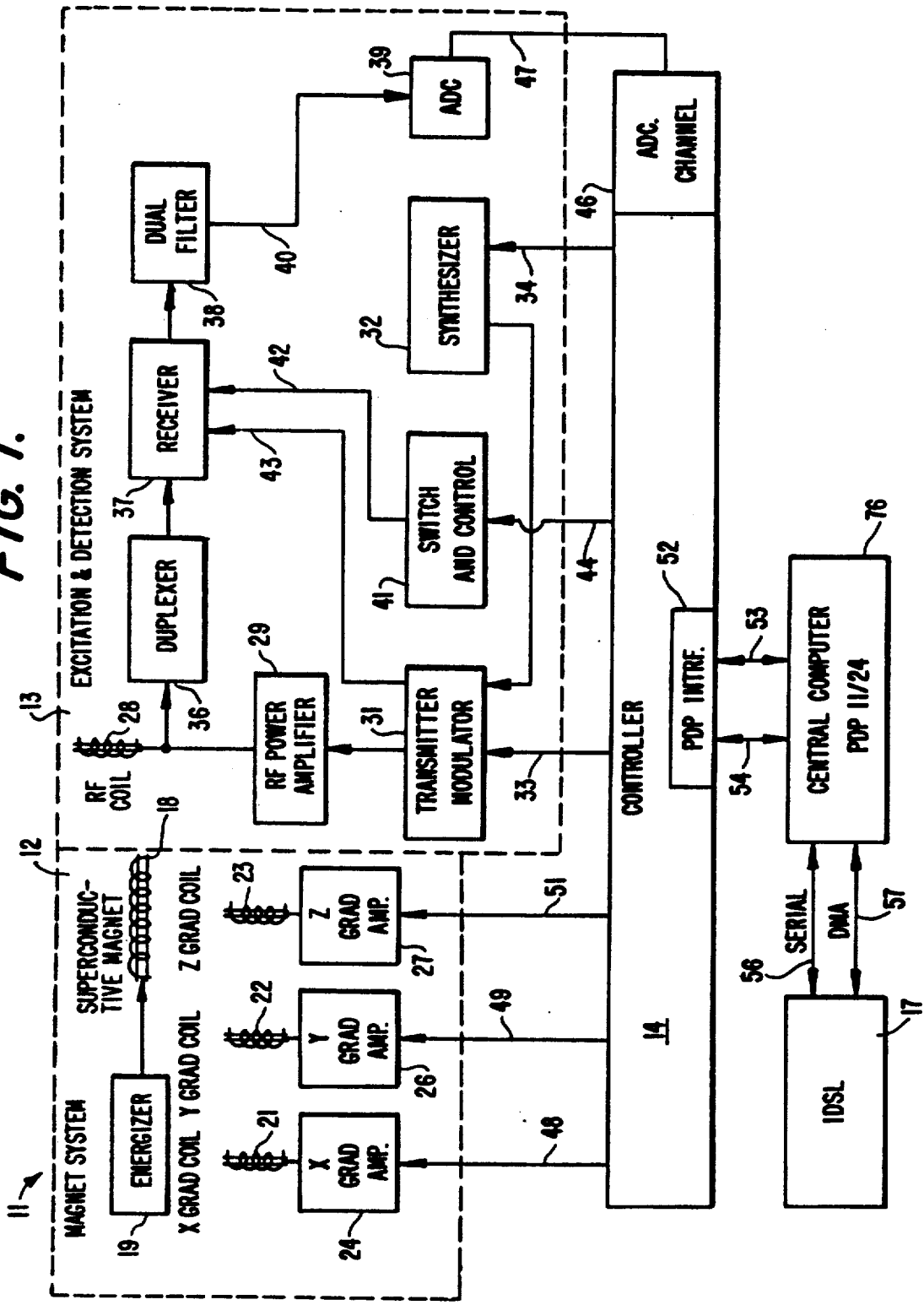
FIG. 1 is a generalized block diagram of an MRI system.

In FIG. 1 at 11 there is shown a general block diagram of an MRI System. The MRI System comprises a main magnet 12, an excitation and detection system 13, a pattern generator and controller 14, a central processing unit (CPU) 16, and a display unit 17.

The magnet system 12 is shown as comprising a super-conductive magnet 18 and a superconductive magnet energizer 19. It should be understood that while the system described herein utilizes a superconductive magnet, the invention is also applicable to MRI systems using other types of magnets such as permanent magnets or resistance magnets.

The magnet system also includes the gradient magnets shown as the X gradient coil 21, the Y gradient coil 22, and the Z gradient coil 23. The gradient coils receive their power from gradient amplifiers; i.e. X gradient amplifier 24, the Y gradient amplifier 26, and the Z gradient amplifier 27.

The excitation and detection system 13 comprises the radio frequency (Rf) coil 28 which may be used both as the transmitting and the receiving coil. The transmitting input to the radio frequency coil is provided by a radio frequency power amplifier 29. The radio frequency power amplifier receives its signal from a transmitter modulator 31. The modulator in turn receives a precise frequency controlled signal from a synthesizer 32, and a further signal for controlling the shape of the pulse from the controller 14 over conductor 33. The synthesizer also receives an input signal from the controller 14 over conductor 34. While a single coil is shown for both transmitting and receiving Rf signals the invention is ideally suited to accommodate systems using individual coils, by providing control signals to separate output channels for transmitting and receiving.

The detection portion of the excitation and detection system 17 comprises a duplexer 36, which prevents the radio frequency power of the amplifier 29 from being received by the receiver 37. The output of the receiver 37 is filtered by filter 38 and the signal from the filter 38 is provided to an analog-to-digital converter, ADC unit 39. An output channel controlled switch and control unit 41 actuates the receiver during the receiving mode over conductor 42. A signal from the modulator over conductor 43 is also supplied to the receiver 37. The switch control unit 41 receives its instructions from the controller over conductor 44.

The output of the ADC unit 39 is provided to an ADC channel 46 in the controller 14 over conductor 47. The controller also provides the signals to the X,Y and Z gradient amplifiers over conductors 48, 49 and 51, respectively.

The controller 14 is coupled to the central computer 16 through an interface circuit 52. Also shown in FIG. 1 are a memory bus 53 and a data bus 54 between the controller and the central computer. As shown in FIG. 1, the information goes to and from the controller and the central computer. For example, the ADC information is directed to the central computer and the display unit 17 for providing the image. Here again the contact between units 16 and 17 is shown as occuring over buses 56 and 57.

Figure 2:
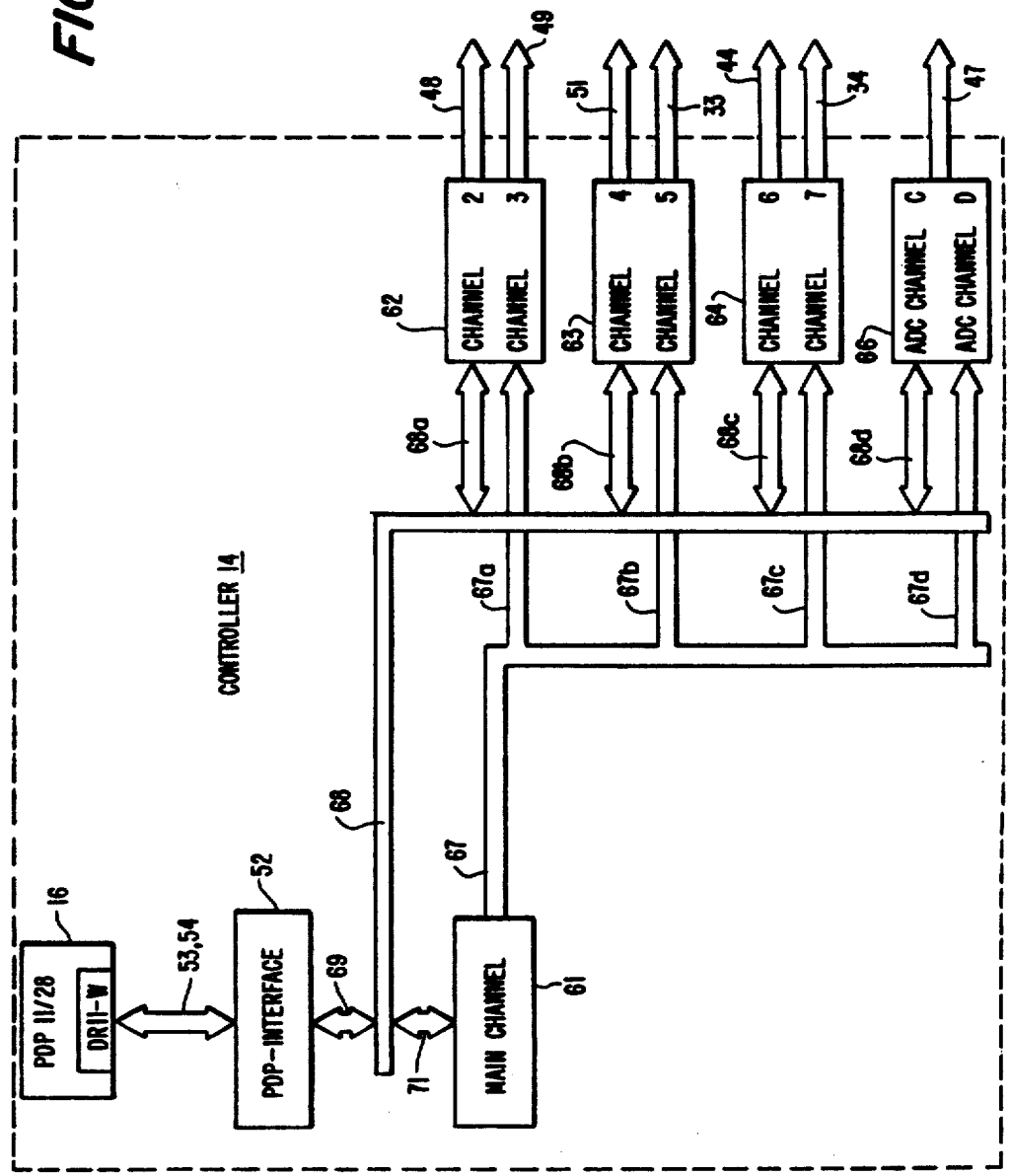
FIG. 2 is a generalized block diagram of the invention pattern generator and controller.

FIG. 2 shows, in block diagram form, more detailed information on the controller 14. The controller is made up of a plurality of channels in modular form so that channels may be added or subtracted within the scope of the invention. In the controller of FIG. 2 there are nine channels shown. There is a main channel 61 which actually functions to control the other channels. The other channels are output channels in dual channel units 62, 63, and 64. Input channels are also provided. Thus unit 56 contains two ADC channels—ADC channel C, and ADC channel D.

Each of the individual output channel units are connected both to the host computer or (CPU) 16 and to the main channel 61. They receive data and/or instructions from both the CPU 16 and the main channel 61. For example, pattern data is received from the CPU and channel run signals are received from the main channel. Acquired data is transfered from the ADC channels to the CPU. The interface unit 52 interfaces between the channels and the computer. The buses between the main channel and the channel units are shown as bus 67 joined to unit 62 through bus 67-a; joined to unit 63 through bus 67-b; and joined to unit 64 through bus 67-c. The ADC channel 66 is joined to the main channel through bus 67-d. The CPU is joined to the channel units through bus 68 that is similarly joined to the individual channels through bus 68 a,b,c and d respectively.

Bus 68 is joined to interface unit 52 through bus 69 and to the main channel through bus 71. The interface and the CPU are joined through bus 53, 54. The channel units are shown as having outputs buses 48, 49, 51, 33, 44, 34 and 17 that connect them to the excitation and detection system as also shown in FIG. 1.

Figure 3:
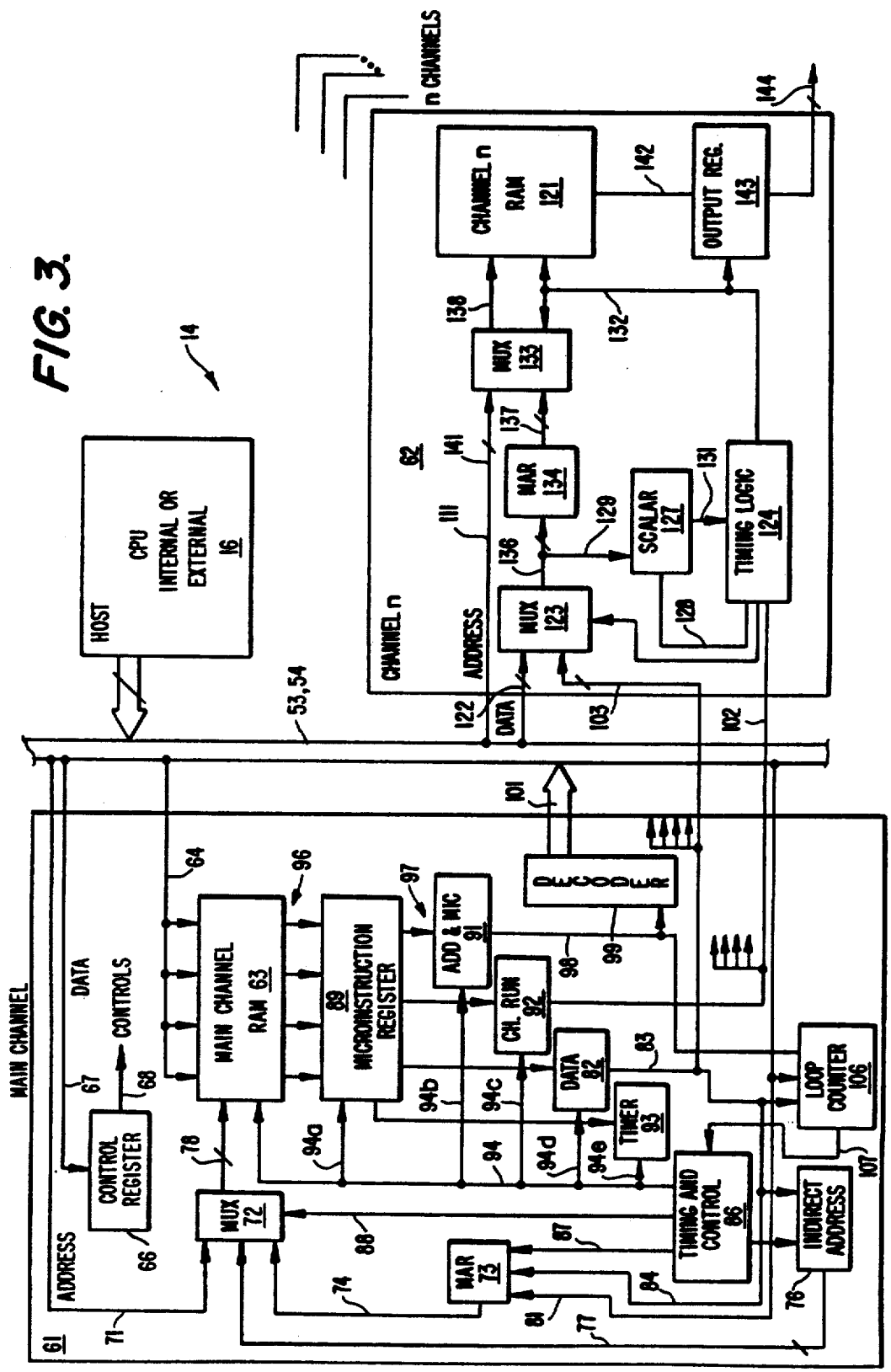
FIG. 3 is a block diagram showing the internal parts of channels which are the main components of the pattern generator and controller.

As shown in FIG. 3 the pattern generator and controller 14 comprises the main channel 61, and a plurality n of individual output channels, such as channel 62. Both the main channel 61 and the n individual channels, such as channel 62, are coupled by bus 53, 54 to the host CPU 16. The host CPU may be an internal or an external processor.

Adding to the versatility of the arrangement the individual channels are very similar containing substantially the same type of units therein so that individual channels can easily be added or individual channels can be taken from the arrangement depending on what is being controlled.

The main channel which controls the individual channels during the actual run of the MR imaging, for example, comprises a plurality of units. Among the units are a memory shown as the main channel RAM 63. Data is transferred from bus 53, 54 over bus 64 to the main channel RAM 63 under the control of a control register 66. Control instructions for the register 66 are received over bus 67. The control outputs of register 66 go to the various units in the main channel 61 as indicated at 68.

Address information for the main channel RAM is connected from bus 53, 54 over address bus 71 and into a MUX circuit 72. This address information is used during the loading of the RAM 63. The inputs to the MUX circuit 72 also include an input from a memory address register MAR 73 on bus 74 and an input from an Indirect Address circuit 76 on bus 77. The information from the MAR 73 is used during the cycle while the controller is generating patterns for example. The indirect address information enables using the same information for a plurality of slices without repeatedly rewritting the same information. The differences in a segment of data are stored at non-sequential addresses reached by the indirect address unit. The MUX 72 connects information from selected ones of its inputs over bus 78 into the main channel RAM 63.

The MAR circuit 73 receives inputs from the data address and control bus 53, 54 over bus 81 and also is connected to a data register circuit 82 over conductor 83 and bus 84. Timing and control inputs to MAR circuit 73 are provided by timing circuit 86 over conductor 87.

Conductor 88 connects the timing and control circuit 86 to the MUX 72. The timing control circuit 88 is also connected to the main channel RAM 63, a micro instruction register 89 (hereinafter often times referred to as "the mic register"), address and control register 91, a channel run register, 92 the data register 82 and a timer register 93 over conductors 94, 94a, 94b, 94c, 94d and 94e, respectively. The "mic register" 89 receives its inputs from the output of the main channel RAM 63 over conductors 96. The mic register sends its outputs to registers 91, 92, 82 and 93 over conductors 97.

The output of the address and control register 91 provides output channel selecting data and operation selecting data and is carried on conductor 98 to a decoder circuit 99. The decoder output is on a bus 101 connected to the main data, address and control bus 53, 54. The output of the channel run register 92 provides a "run" signal for the selected output channel and appears on bus 102 connected directly to each of the individual output channels such as channel 62. The output of the data register 82 provides the starting address data of the pattern of words to be output by the selected output channel and rate of change of output data for the selected output channel. This data appears on conductors 83 and controller data bus 103 connected to the individual output channels.

Means are provided for repeating the output of particular patterns. More particularly a loop counter 106 is coupled to data bus 81 as well as to data register 82 over conductor 83. The output of the loop counter is on conductor 107 and connects the loop counter to the timing and control circuit 86.

This output of the mic register includes: address and control signals which are provided to the decoder 99; channel RUN signals which indicate to each of the individual channels to transfer to the RUN condition, control data for denoting the starting address of output channel patterns sent through the data 82 register to the individual channels, and timing data which goes to the timer register 93 and from there to the timing and control circuit 86 to provide timing signals to monitor and coordinate the activities of the various units making up the main channel.

Means are provided for repeating portions of instructions during a cycle which are the same as previous instructions and then jumping to an address that has the different parts of the instructions. For example, where during a cycle Rf pulses are repeatedly transmitted with all characteristics except the frequency being the same—the instruction data will be transmitted from one address for all the Rf pulses transmitted with the different frequency values obtained from different addresses—not necessarily sequential. More particularly the indirect address unit 76 enables causing repeat instructions to be properly placed into the RAM with portions of the instructions that are not repeated placed to be indirectly addressed. If there are two separate instructions to different channels, for example, that are alike in most characteristics but not alike in one characteristic then the characteristics that are alike are simply repeated for the second channel while the characteristic that is not alike is indirectly addressed and placed into the proper channel, which greatly simplifies the control functions.

Means are provided for selecting one of the plurality of addressing inputs and switching the information on the selected input to the RAM 63. More particularly MUX circuit 72 enables the address data on bus 71, or the indirect address on bus 77 or the address data from the MAR 73 to be read into the main channel RAM at the desired times. Thus the main channel 61 receives data, data instructions and timing information from the host and it generates controller data and feeds out channel select data, starting address data, output rate of change data and timing channel run data to control the individual channels.

Individual output channels such as channel 62 comprises a plurality of units similar to the units in the other output channels. For example, each individual output channel has a channel memory means such as channel RAM 121. The channel RAM 121 receives pattern data from data address and control bus 53 coming from the host CPU over a data bus 122 which is connected to a MUX circuit 123. Another input to the MUX circuit is the controller data on bus 103 which brings starting address data and output data of rate change. The timing of the MUX circuit 123 is controlled by timing logic of the timing logic circuit 124 individual to each of the individual output channels. The timing logic circuit 124 receives its control data over conductor 102 from the channel run register 92 of the main channel. The timing logic circuits 124 also provides timing signals to the MUX 123 over conductor 126.

Means for effecting output rate of change data is provided. More particularly there is shown a scaler unit 127 which receives inputs from the timing logic circuit 124 on conductor 128 and from the output of MUX 123 on conductor 129 and has an output to the timing logic circuit 124 over conductor 131. The arrangement provides timing control outputs on conductor 132. Conductor 132 connects to MUX circuit 133 over conductor 132a. The MUX circuit 133 obtains an input from means for effecting the starting address of the output pattern shown as a memory address register (MAR) 134. Address data is supplied to MAR 134 from the output of MUX 123 over bus 136. The output of MAR 134 is connected to MUX 133 over bus 137. Another address data input to the MUX circuit 133 is from address bus 141 connected to the data, address and control bus 53, and 54. This input is effective when the CPU is coupled to the controller. The input from MAR 134 is used during the cycle execution i.e. to generate the output pattern.

The output of the RAM 121 appears on bus 142 connected to an output register 143. Timer control signals for the output register are received over conductor 132b and conductor 132 from timing logic circuit 124. The output register sends its output data over bus 144 which is the digital output pattern of each individual channel 62.

It should be understood that the showings of the main channel and the individual channels herein are simplified. There are many functional circuits which are not shown. For example there is no showing of the status circuitry, a parity circuitry, error control circuitry, last word check circuitry, etc. The showing herein is to provide teachings to those skilled in the art sufficient to enable the versatile control of an MRI system without the use either high power computers or multiple computer units. The pattern generator and controller as shown herein, provides for high speed operations since the controllers utilize independent time circuitry. The circuitry includes the capability of repeat functions with a loop counter and indirect addressing with the indirect address circuit which enables repeat operations with minor changes. In addition because of the modular construction, it is possible to add or take away channels depending on the operations required.

Figure 4:
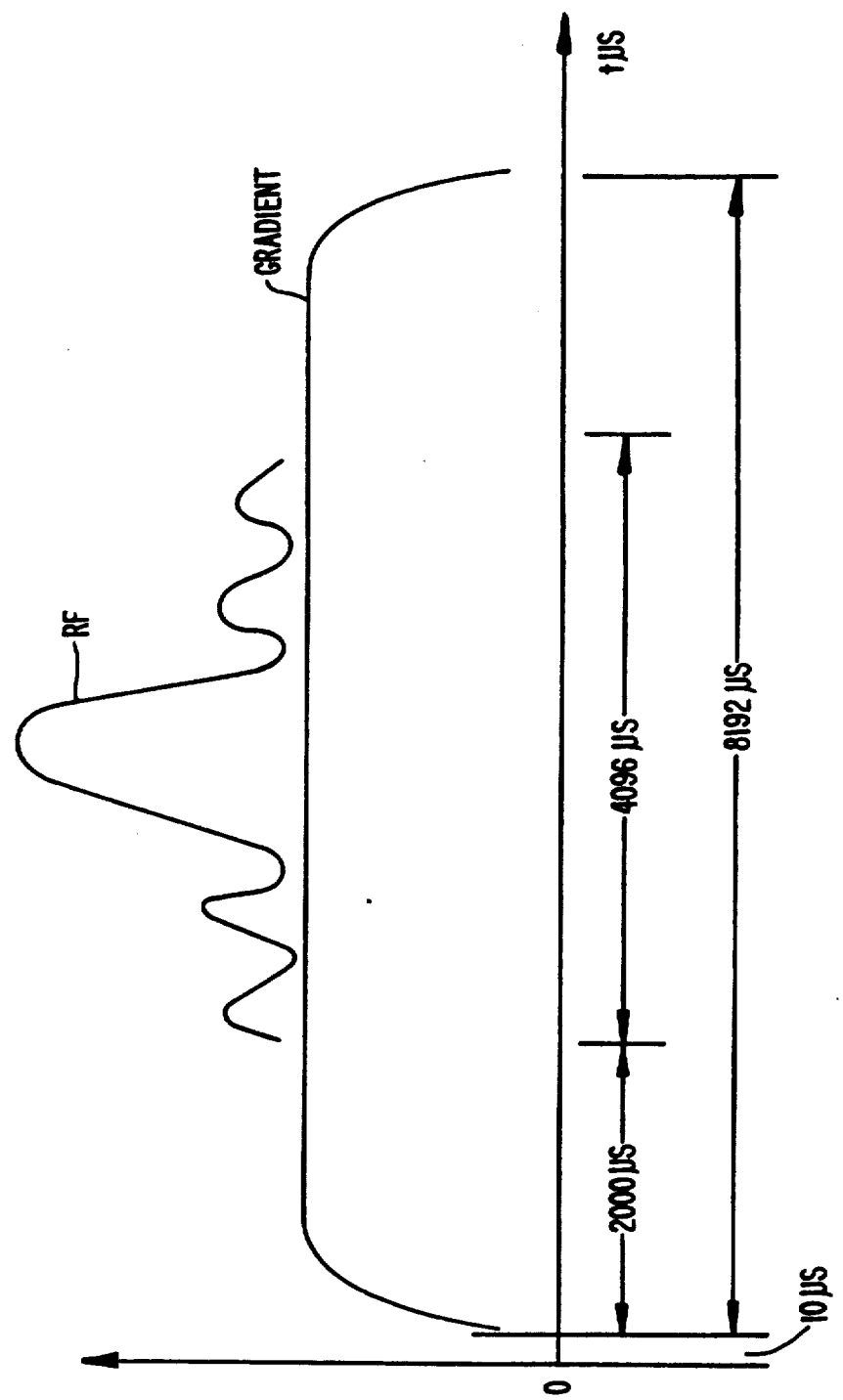
FIG. 4 illustrates outputs provided under the control of the pattern generator and controller.

In operation, before a scan of a subject commences, the pattern generator and the controller 14 and the system CPU or host computer are coupled together in the "computer mode". In this mode the main channel control register 66 puts out a signal such as a control register bit zero equals zero and a host enable signal equals zero. Responsive to such control signals, the host CPU is attached to the controller and loads the controller memory with data needed to run a cycle. The data of the main channel is divided into the following four parts: time data, start address data, channel run data and address mic data. FIG. 4 shows an example of pulses i.e. a gradient pulse and an Rf pulse that the inventive system will transmit responsive to patterns from the controller to provide the operational signals to an MRI system.

Note that, gradient pulse of FIG. 4 extends over 8192 micro-seconds. The resolution definition in the example is 128 points to define the gradient pulse over the 8192 micro-seconds. This means that there will be a digital data point every 64 micro seconds. The Rf pulse shown extends over 4096 micro-seconds. The resolution definition for example requires 256 digital data points; i.e. that a point be provided every 16 micro-seconds.

Table I shows the instructions as received from the CPU.

TABLE 1

MAIN CHANNEL INSTRUCTIONS FOR THE PULSES OF FIG. 4.

| LINE | TIMER REGISTER | DATA REGISTER | CH. RUN REGISTER | ADO-MIC REGISTER |
|---|---|---|---|---|
| 1 | 2 | 100 | | 4,2 |
| 2 | 8 | 64 | | 4,4 |
| 3 | 10 | | 1 | 0 |
| 4 | 10 | 200 | 1 | 5,2 |
| 5 | 1970 | 16 | 1 | 5,4 |
| 6 | 4096 | | 1,1 | |
| 7 | 10 | | 1 | |
| 8 | 2096 | | 1 | |

In the first line of the instruction received from the CPU the timing field register is set at say 2 microseconds so that the data register receives data 100 which is start address data for the MAR; the channel run register receives nothing since no channel is run as yet and the mic-address register receives data (4) indicating the channel for the Z gradient and a pulse pattern (2) to be outputted.

The starting address data is outputted by the data register to provide the starting address of the pattern of words to be outputted by the particular output channel selected. The CPU writes address information and timing instructions to the main channel and patterns to the output channels.

The address information put into the main channel RAM 63 contains information data as to which channel is to be activated and what operation is to be performed by output channel. The information put into the main channel 61 from the host CPU is stored in the main channel RAM. It is placed there under the control of the control register and also passes through the MUX 72 from either the address bus, the MAR 73 or the indirect address unit 76. Thus the address information goes through the MUX 72 to the main channel RAM. The data MAR timing register data defines when the next micro-instruction is fetched. For example, the second line of instructions in Table I is to be fetched in 8 micro-seconds after the first word. Thus digits having a value of 8 are placed into the timer register. In line 2 the data register value 64 is data for the scaler 127. The second line also shows that the channel RUN does not have any signals yet, thus the channel selected channel is not running; it is being set. Line 2 instructions indicate that the information is once again for operating the Z gradient channel 4 and the function 4 rather than 2 to indicate a different operation; such as for reading or writing, for example.

The third line of instructions occurs 10 micro-seconds after the second line as indicated by the 10 micro-seconds in the timer register. There is no MAR or scaler data in the data field. There is now a channel run signal which causes the gradient pulse to actually be outputted from the output channel 4. The channel run bit of that channel 4 that is to deliver a pattern is activated; i.e. the fourth bit would be turned active, for example, when the fourth bit turns active the Z gradient output channel starts to output data stored in its memory.

It is possible to activate more than one bit in this field at the same time. That is more than one channel can output a pattern of words at the same time adding to the versatility of the system. Further it is also possible to write to an output channels MAR or scaler and send the channel RUN active signal in the same micro instruction.

The add and mic register (or field) 91 also contains specific micro controller (MIC) instructions. For example, the loop counter is controlled to take the next command from:

1) the next line of the program if the loop counter has a zero value; or
2) the address written in the data field if the command of the loop counter is not zero. Thus the loop counter effectively tells the output channel "repeat the pattern" and enables the system to go to the next line.

The mic register contains various controls for example when MIC zero is active a new micro instruction is fetched with the next clock; i.e. after one micro second where a one micro second clock is used regardless of what is written in the timer register. The MIC register can also control the clock to provide either a slow or fast clock. The MIC register 89 provides signals for the CPU to show that the controller is in the program mode, for example, enabling reading from or writing to the controller by the CPU.

In the third line the instructions are fetched 10 microseconds after the second line instructions. The instructions keep channel 4 running.

In the fourth line the starting address is indicated as 200; the gradient pulse is still running so that the channel run signal still is active as at the channel four position.

The instructions of line 5 indicate that the Rf pulse starts at 2000 micro-seconds after time zero, therefore the instructions show 1970 in the timer field because 30 micro-seconds of the lapsed time were taken up in the previous steps. The data register has the scaler information 16 to indicate that every 16 micro-seconds there is going to be a digital point. At this juncture channel 5 has not started to run it is still being loaded so the channel run register is only active at the bit for operating the gradient channel.

The instructions of line 6 indicates the length of the radio frequency pulse as 4096 in the timer register. No data is required for the data register. The channel run register indicates that channel 5 is made active. No address is needed at this time.

Line 7 indicates a reading 10 micro-seconds after the radio frequency pulse. No additional data is needed. The radio frequency channel 5 is not operating; so only the gradient channel is operating as indicated. No address information is needed.

The last line directs the occurence of the end of gradient pulse to occur 2096 micro-seconds after the line 7 directed occurrence. The timer field is set at 2096 micro-seconds. No data is necessary for the data register, the channel run register or the add-mic register. The table one instructions are read into the main channel. The output channels have pattern information read into them.

All information is thus stored in the channel memories. The system goes into the cycle execution mode. During this mode the output channels are controlled by the main channel. The system is run at times determined by the clock of the main channel or any external clock desired. The run time is not limited by the CPU clock or functions. When the main channel sends a channel signal to a particular output channel, then that channel outputs a pattern in its run mode. Otherwise it is in a stand mode. After the cycle has been executed then once again the CPU is interupted and reattached to the controller. It once again provides data to the output channels and the main channel. After loading this data the system returns to the cycle execution mode and the next cycle starts. Note that is is possible for an output channel to remain in the run mode while the system is in the program mode; however, if and when this is done it is not possible to write into that channel's memory. This feature is useful for example, to speed up the last and penultimate cycles. After the operation of the program mode the system again returns to the cycle execution mode for unloading data.

While the invention is described using particular examples, it should be noted that these examples for purposes of explanation only and not as limitations on the invention which is defined by the accompanying claims.

What is claimed is:

1. A method for controlling radial frequency pulse excitation and gradient pulses applied during a scan cycle in a magnetic resonance imaging (MRI) system, said system including a magnet (magnets), excitation and detection units, a controller comprising a main channel and a plurality of output channels, said MRI system operated responsive to operating data including: instructions, timing information and RF pulse pattern data provided by a central processing unit (CPU), said method comprising the steps of:

transmitting said operating data from the CPU to the controller;
   storing said operating data received from said CPU in said main channel and said output channels,
   controlling the scan cycle with the controller using said operating data received from said CPU;
   commencing the scan cycle when said instructions and timing information included in the operating data are received from the CPU by said main channel and when the RF pulse data is received by at least some of said plurality of output channel;
   said controlling step, including the steps of:
   transmitting instructions and timing information for controlling the output of the received RF pulse pattern data from the at least some of said output channels responsive to the instructions and timing information stored in said main channel after receipt from said CPU; and
   controlling said excitation units of the MRI system with said RF pulse pattern data;
   wherein the step of transmitting data from said CPU to said main channel and to said output channels further includes the steps of:
   transferring scan sequence cycle control from said CPU to said main channel after receipt by said controller of said operating data from the CPU;
   energizing the excitation units of the MRI system responsive to said operating data to perform a scan sequence cycle while control of the scan sequence cycle is in said main channel after transfer of control from said CPU to said main channel;
   returning scan sequence cycle control to said CPU from said main channel at the end of said scan sequence cycle whereby the scan sequence cycle is accomplished under control of said controller instead of said CPU, and
   defining said scan sequence cycle using the timing information transferred from said CPU to said main channel;
   and further including the step of transferring said instructions and timing information from said main channel to said output channels, said last named transferring step including:
   selecting the at least some of said output channels,
   providing said instructions to a data field in said main channel, and timing information to a timing field in said main channel for selecting starting addresses in said selected output channels to output pattern data,
   providing said instructions to a data run field in said main channel for selecting either a "run" or a "standby" condition for said selected output channels, and
   providing an address and control field in said main channel for instructions for activating the selected output channels to control desired ones of said MRI system units.

2. The method of claim 1, including the steps of:
   controlling the output of the RF pulse pattern data from said output channels responsive to instructions from said main channel, and
   controlling the timing of outputs from each of said output channels responsive to timing information stored in said main channel.

3. The method of claim 1 including the step of:
   selectively transferring said instructions for selecting starting addresses into selected output channels responsive to instructions and timing information received from said CPU through timing and control means in said main channel.

4. The method of claim 3 including the step of generating indirect addresses in said main channel, using the indirect addresses to automatically repeat output portion of address data for use in locating operating data to be repeated in said main channel memory means.

5. The method of claim 4 including the steps of:
   causing previously outputted data to be automatically repeated when said previously outputted data is again required.

6. The method of claim 5 including the steps of:
   supplying the starting address of an RF pulse pattern to be outputted by said output channel,
   transferring receiving data from said main channel to said selected output channel, and
   defining in said selected output channel the starting address of the output data.

* * * * *